(12) United States Patent
Wang et al.

(10) Patent No.: US 8,962,353 B2
(45) Date of Patent: Feb. 24, 2015

(54) SYSTEM AND METHODS FOR SEMICONDUCTOR DEVICE PERFORMANCE PREDICTION DURING PROCESSING

(75) Inventors: Jen-Pan Wang, Tainan (TW); Chao-Chi Chen, Tainan (TW); Yaling Huang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 13/234,964

(22) Filed: Sep. 16, 2011

(65) Prior Publication Data

US 2013/0071957 A1    Mar. 21, 2013

(51) Int. Cl.
*H01L 21/66* (2006.01)

(52) U.S. Cl.
CPC ............. *H01L 22/20* (2013.01); *H01L 22/12* (2013.01)
USPC .................................... 438/17; 257/E21.521

(58) Field of Classification Search
USPC .......................... 438/121, 17; 705/7
See application file for complete search history.

(56) References Cited

U.S. PATENT DOCUMENTS

| | | | |
|---|---|---|---|
| 6,368,884 B1 * | 4/2002 | Goodwin et al. | 438/14 |
| 6,459,950 B1 * | 10/2002 | Kawazome | 700/121 |
| 6,645,790 B2 * | 11/2003 | Moghe et al. | 438/107 |
| 6,768,384 B1 * | 7/2004 | Mohandas et al. | 330/308 |
| 2004/0200574 A1 * | 10/2004 | Davis et al. | 156/345.1 |
| 2008/0277764 A1 * | 11/2008 | Ferru et al. | 257/618 |
| 2009/0157455 A1 * | 6/2009 | Kuo et al. | 705/7 |
| 2009/0215206 A1 * | 8/2009 | Singhal et al. | 438/17 |

* cited by examiner

*Primary Examiner* — Zandra Smith
*Assistant Examiner* — Damian A Hillman
(74) *Attorney, Agent, or Firm* — Slater & Matsil, L.L.P.

(57) ABSTRACT

Methods and systems for predicting semiconductor device performance criteria during processing. A method is described that includes receiving a semiconductor wafer; performing semiconductor processing on the semiconductor wafer forming active devices that, when completed, will exhibit a device performance criteria; during the semiconductor processing, measuring in line at least one device performance criteria related physical parameter; projecting an estimated value for the device performance criteria of the active devices using the at least one in line measurement and using estimated measurements for device performance criteria related physical parameters corresponding to later semiconductor processing steps; comparing the estimated value for the device performance criteria to an acceptable range; and determining, based on the comparing, whether the active devices on the semiconductor wafer will have a device performance criteria within the acceptable range. A system for processing semiconductor wafers that includes a programmable processor for performing the methods is described.

20 Claims, 8 Drawing Sheets

SYSTEM AND METHODS FOR SEMICONDUCTOR DEVICE PERFORMANCE PREDICTION DURING PROCESSING

BACKGROUND

During integrated circuit manufacturing using semiconductor processing and equipment, a common manufacturing goal is to provide circuit devices with a desired performance within a range of acceptable performance. Certain device performance criteria are often used to establish that the devices completed on a semiconductor wafer do, or do not, meet the established criteria for an acceptable wafer. For example, when manufacturing integrated circuits including metal oxide semiconductor field effect transistor (MOSFET) devices on semiconductor wafers, the drain current measured when a MOSFET is in a saturation mode (Idsat) is one objective measure of device performance that may be evaluated. Other measurable criteria may be selected, such as a threshold voltage (Vt), for example.

In the known approaches, this testing is performed after the wafer is completed through the semiconductor processing, but prior to the dicing of the individual integrated circuit devices (ICs) from the semiconductor wafer, at a stage known as the wafer acceptance test ("WAT"). At WAT, probes may be placed onto pads coupled to various active devices within the integrated circuits that are formed on the semiconductor wafer, and certain measurements may be made. If the device performance measured at WAT is not acceptable, then the wafer, which has been processed through many expensive and time consuming processing steps, and the materials used to perform the semiconductor manufacturing process, are wasted. Further, the determination of which steps or processes are causing the unacceptable performance may be difficult, so reduction of or elimination of further defective wafers is also difficult. The testing at the WAT station is also costly and time consuming, and testing numerous defective wafers (wafers with devices that will not meet the range of acceptable performance criteria) is also inefficient.

A continuing need thus exists for methods and systems to evaluate device performance during semiconductor processing and to accurately predict when the completed devices will, or will not, have acceptable performance. Improvements are needed to increase manufacturing yields, and to reduce the waste of time and waste of expensive materials in semiconductor manufacturing currently experienced when using the known methods.

BRIEF DESCRIPTION OF THE FIGURES

For a more complete understanding of the present embodiments, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments or the claims.

Embodiments of the present application which are now described in detail provide novel methods and system for manufacturing semiconductor devices efficiently by accurately projecting device performance during semiconductor processing. In a method embodiment, if the projected device performance is within an acceptable performance range; then the embodiment proceeds by continuing the processing, and if the projected device performance is not within an acceptable range, the method of adjusting the processes in subsequent steps to bring the device performance within an acceptable performance range during manufacturing. By performing the prediction steps and the adjustment steps well prior to the completed wafer WAT tests, yield is improved, throughput is improved, cycle time is reduced, the costs for finished integrated circuit devices are reduced; and wasted time and wasted materials are reduced over the prior approaches.

Figure 1:
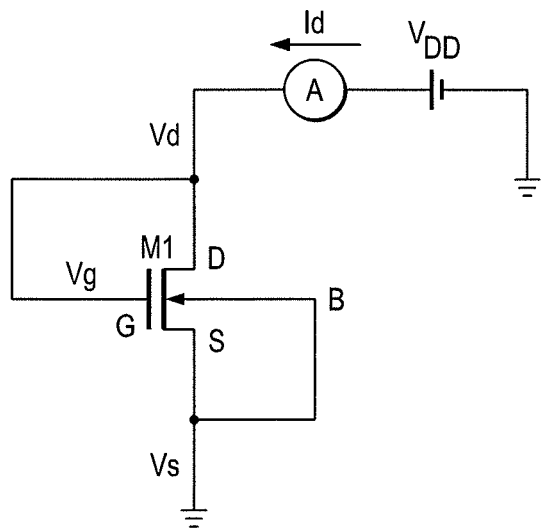
FIG. 1 depicts in a circuit diagram a MOSFET transistor for use with the embodiments.

FIG. 1 depicts a typical circuit schematic for a MOSFET transistor M1. In an application of the embodiments, integrated circuits may be fabricated on the semiconductor wafer having thousands or perhaps millions of these devices. The example MOSFET M1 has four terminals, a source terminal 'S', a drain terminal 'D', a gate terminal 'G', and a body terminal 'B'. In FIG. 1, voltages at these terminals are labeled Vg for the gate, Vd for the drain, and Vs for the source. As is known in the art, the MOSFET M1 will flow drain current Id from the drain terminal to the source when an appropriate voltage Vg at the gate terminal G exceeds a threshold voltage (Vt). Also, as is known in the art, the MOSFET transistor device may operate in a cutoff region, in a linear region or in a saturation region. For use with digital logic circuitry, the MOSFET devices are typically operated in a saturation mode, or in a cutoff mode. Because the MOSFET devices can be either "on" (in saturation mode), or "off" (in cut off mode), the MOSFET devices may effectively perform as digital switches for use in logic circuitry.

In saturation mode, the drain current Idsat, for a MOSFET is given by:

$$Idsat = \beta/2\ [Vgs - V_t]^2,\ \text{When}\ Vgsat < Vdsat + V_t\ (\text{because}\ Vdsat = Vgsat)) \quad \text{Equation 1}$$

In Equation 1, the gate voltage Vg is assumed to be equal to the drain voltage Vd, so that the relationship of Equation 1 is appropriate for the drain current for a MOSFET in saturation mode.

In FIG. 1, the transistor M1 is coupled in a circuit to measure Idsat. The source and body terminals 'S' and '13' are coupled to ground, the gate terminal 'G' is coupled to the drain terminal 'D' and both are coupled to a supply voltage $V_{DD}$. In an example integrated circuit this voltage $V_{DD}$ may be a supply voltage level such as 5 Volts, 3.3 Volts, or increasingly, an even lower supply voltage such as 2 Volts. The transistor M1 is placed in saturation mode and the current Id is measured by the ammeter A. This current represents an important device performance criterion often used to evaluate proper device performance. Conventionally Idsat may be measured on a completed wafer at a WAT station to determine if the MOSFET transistor devices on a selected wafer under test are acceptable for further processing, such as packaging and circuit testing. The embodiments herein provide advantages over the prior approaches by accurately predicting device performance during wafer processing.

Figure 2:
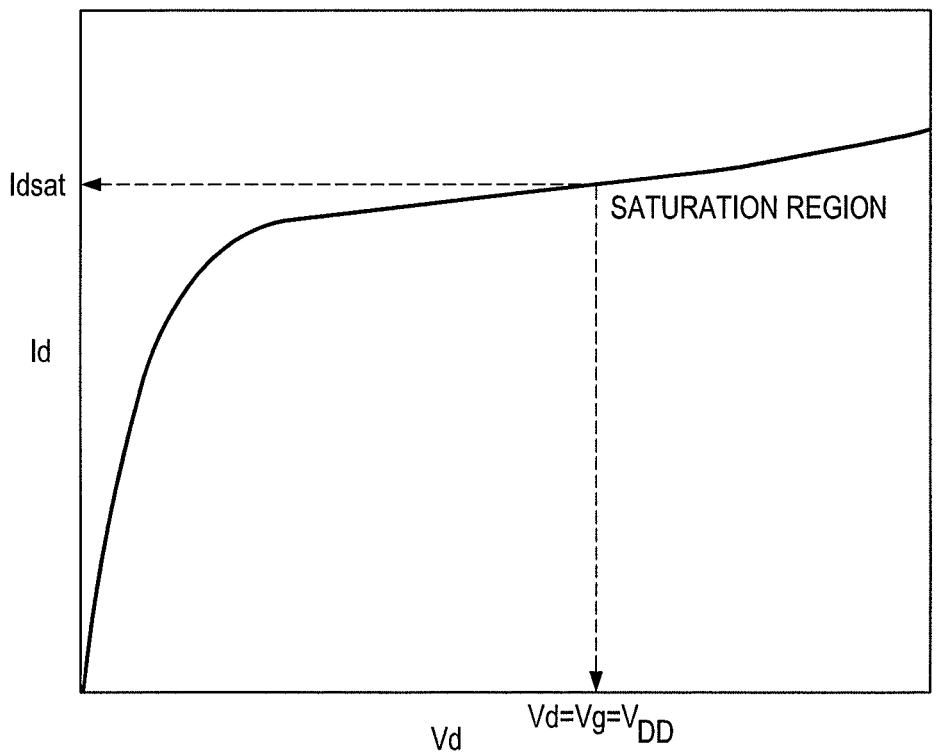
FIG. 2 depicts in a graph the current-voltage characteristic curve for the MOSFET transistor of FIG. 1 including a saturation current Idsat.

FIG. 2 depicts in a graph the current-voltage characteristic curve for a MOSFET transistor, and the figure indicates the transistor operation in the saturation region. The drain current Id is shown on the vertical axis and the voltage at the drain terminal Vd is shown on the horizontal axis. In addition, the curve in FIG. 2 assumes the gate voltage Vg is tied to the drain voltage Vd. As is known, when a transistor operates in saturation mode the current Idsat tends to increase only slightly with further increases in the gate or drain voltages. In FIG. 2, the drain current for a transistor in saturation mode, Idsat, is shown as a point on the vertical axis, the voltage Vdsat=Vgsat is shown as $V_{DD}$ on the horizontal axis. So the current into the drain Id of the MOSFET when the gate and drain voltages are set to $V_{DD}$ is shown as the Idsat current.

Figure 3:
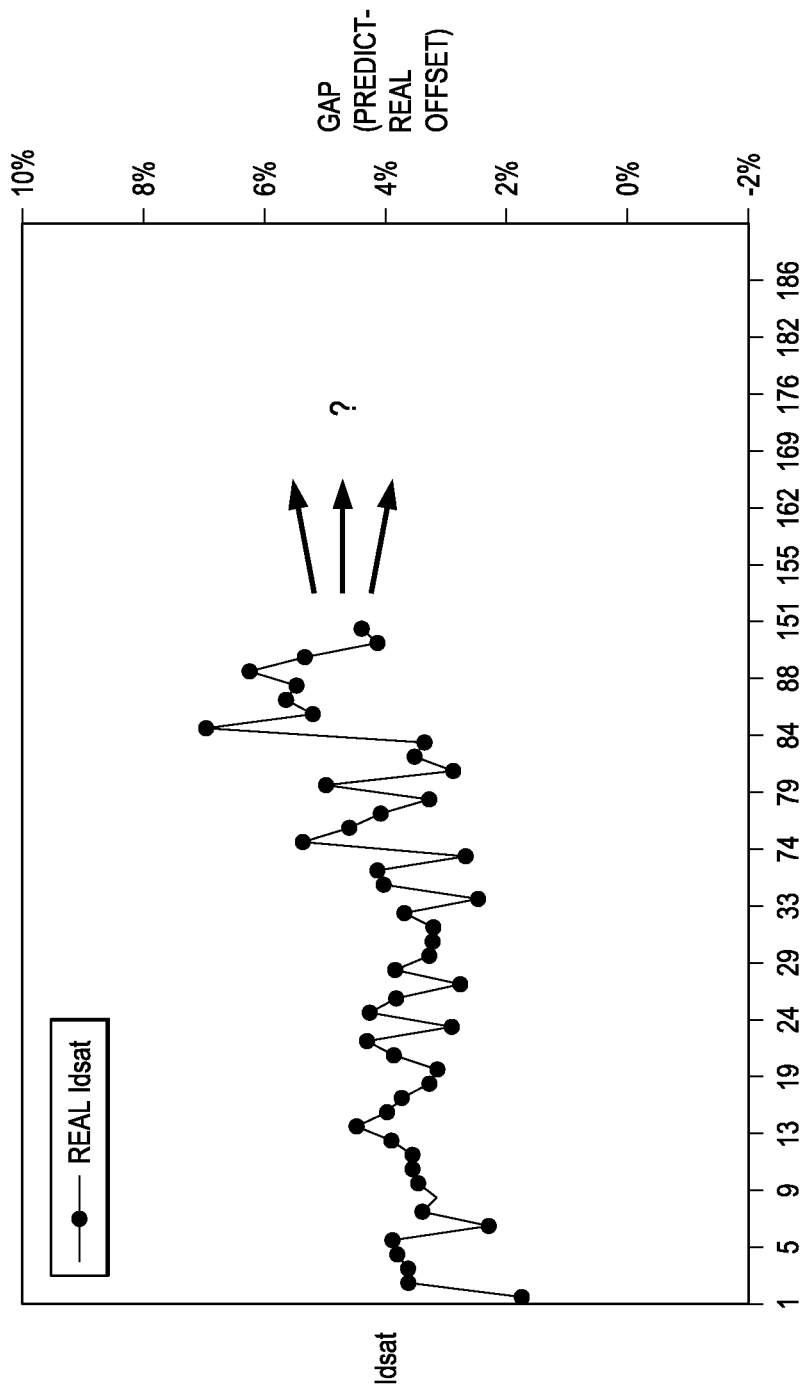
FIG. 3 depicts in a chart the Idsat performance for devices on wafers observed after completion of wafer processing.

FIG. 3 is a chart showing real Idsat measurements obtained from actual wafer lots at the WAT or wafer acceptance test stage of manufacturing over a time period. The Idsat expected for wafers still in processing is not known, as indicated by the question mark in FIG. 3. The other points are real data points normalized for illustration. Using conventional methods, the Idsat (or other selected performance criteria; Idsat is presented here for illustration and is just one non-limiting example criterion) for devices fabricated on a particular wafer is unknown until the WAT stage. If it is determined after manufacture of the wafer is completed that the circuit performance indicated by the Idsat device performance criterion is not within an acceptable range, then the wafer may be labeled as defective and scrapped, and it may be difficult to determine why the wafer did not perform correctly. The completed devices will also be scrapped, reducing yield and increasing costs of the devices that are manufactured. Conventional WAT procedures do not detect variances in device performance during semiconductor processing; instead, the entire wafer is completed first and testing is then performed on completed wafers. Idsat is one example of an objective measurement of device performance and that may be evaluated, Idsat measurements obtained at the WAT test. WAT testing is performed after the wafer is completed through the semiconductor processing.

FIG. 3 is a graph illustrating real Idsat measurements after WAT test and illustrates the detected variances in device performance after the wafer is completed. The Idsat performance that will be achieved for wafers still in processing is unknown until WAT test. This is illustrated in FIG. 3 by the question mark, indicating those wafers are still in process. In a conventional approach, [t] process adjustments are made for future wafers after detected variances from real Idsat of completed wafers becomes available. This increases cycle time. Real Idsat device performance criteria may not be within an acceptable range, and in the conventional approach if that is the case, then the wafer may be labeled as defective and be scrapped. Scrapping wafers reduces yield and increases costs of the devices that are manufactured.

Figure 4:
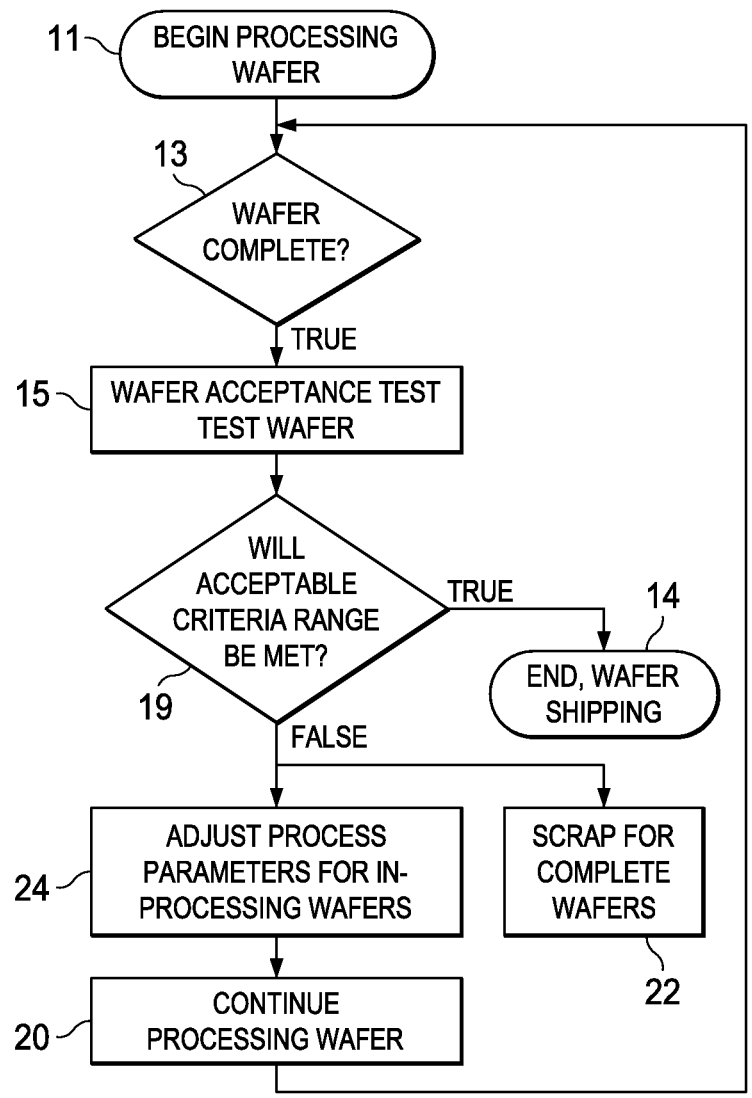
FIG. 4 depicts in a flow diagram a conventional approach to wafer acceptance testing using a performance criteria.

FIG. 4 is a flow chart diagram illustrating a conventional WAT approach to Idsat measurement. Other measurable criteria may be used, such as threshold voltage (Vt) or other criteria that may be measured at a wafer probe stage. In FIG. 4, a criteria test is performed on a completed wafer. Process adjustments may be made responsive to the measurements for wafers coming in line or already in process to place the criteria within an acceptable range. However, if the completed wafer has a performance criterion that is not within an acceptable range, it will have to be scrapped.

In FIG. 4, the flow diagram begins at step 11, where the wafer processing begins. In step 13 a conditional test is made, to see if the wafer processing is complete. If the wafer process is complete for a particular wafer, the flow diagram transitions to step 15 where the wafer acceptance test (WAT) is performed. At step 19, a conditional test is performed to determine if the measured criteria is within an acceptable range. If the acceptable range is met, the condition is true, and the flow diagram transitions to step 14, where the process ends with the wafer being shipped onto further steps or shipped to a customer or packaging facility.

If the condition at step 19 of FIG. 4 is false, then the flow diagram transitions to steps 22 and 24. At step 22 the completed wafers are scrapped. This is costly because the devices on these wafers are lost, as well as increasing costs due to the wasted process materials, chemicals, and time on machines and testers that was used on material that did not yield any devices. At the same time, when the condition is false at step 19, the flow diagram transitions to step 24, where process adjustments may be made for wafers still in processing. These wafers may be adapted to become acceptable wafers by changing the process conditions in response to the scrapping of the completed wafers. However, the conventional approach cannot make a determination until some wafers are completed and tested and material is wasted as a result. After the process adjustments at step 22, the flow diagram shows a transition to step 20, where processing of the in process wafers continues, and the flow diagram repeats.

Figure 5:
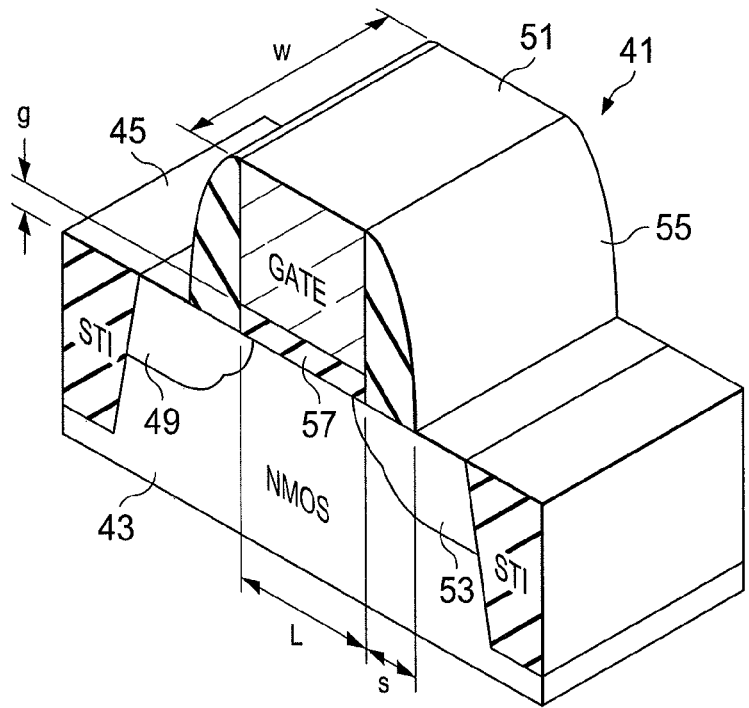
FIG. 5 depicts in a three dimensional cross-sectional view a planar MOSFET device for use with the embodiments.

In order to better understand the factors that contribute to the device performance criterion Idsat, some illustration of the device related parameters that relate to the physical characteristics of MOSFET transistors are now provided. In FIG. 5, an illustrative embodiment NMOS transistor 41 is shown in a simplified three dimensional view. A semiconductor substrate 43, or in an alternative approach, a layer of semiconductor material such as a silicon on insulator ("SOI") layer 43 is shown. Source and drain diffusion regions 49 and 53 are shown formed in the substrate. Note that these diffusion regions are typically symmetrical and in this example either 49 or 53 may be the source, or the drain, depending on the circuit connections made to these diffusion regions. As is known in the art, these regions may be formed as diffusions that are self-aligned to the gate 51, or may not be self-aligned. Also, thermal diffusion, deep implants of dopant atoms, tilted or angled dopant implants, and pocket implants directing dopant atoms underneath the sidewalls 55 or the gate 51 may be used as part of the process for forming the source and drain regions. For an NMOS device such as transistor 41, a p type semiconductor substrate is used, and the source and drain regions may be doped to n-type conductivity. Gate dielectric 57 is formed of an oxide, a nitride, an oxynitride, or other known high k or low k dielectrics and is grown or deposited to a predetermined gate dielectric thickness. A gate electrode 51 is shown overlying the gate dielectric 57 and the region underneath the gate forms a channel region. The distance between the source and drain regions under the gate form a channel length 'L', and the distance of the gate along the source and drain diffusions form the channel width 'w'. The gate is a conductor and may be a polysilicon layer that is patterned and doped to be conductive, or, may be a metal-containing gate structure. The gate sidewalls 55 are dielectrics and in alternative embodiments may be formed of single or multiple layers. The gate sidewalls 55 have a sidewall dimension 's'. As is known in the art, the gate dielectric may be formed over the substrate, the gate conductor may be formed over the gate dielectric, these may be patterned using photolithography and etch steps, a shallow source and drain diffusion may be performed aligned to the gate electrode, the sidewalls may be formed over the substrate and the gate, and then patterned and etched, and these may be used to mask the shallow source and drain regions under the sidewalls while deeper source and drain region implants are performed. Thermal steps including anneals and thermal diffusions may be performed at various stages of the process. The isolation regions 45 may be formed as shallow trench isolation (STI) regions including a dielectric in a trench, or in an alternative approach, local oxidation of silicon (LOCOS) may be used to form isolation regions.

When the $V_{DD}$ voltage Vgsat is applied to the gate terminal and $V_{DD}$ is applied to the drain terminal Vdsat (as shown in FIG. 1), a current Id will flow from the drain to the source as a channel forms beneath the gate dielectric 57. When the device is operated in saturation mode, this current will be Idsat, as shown in FIG. 2.

The sidewalls 55 formed on the gate structure are dielectric and may be oxides, nitrides, or other materials that form dielectrics. As is known in the art, the sidewalls may be formed in multiple levels using differing materials, and these may be compatible with selective etch steps.

As shown in FIG. 5, some key device related parameters are the channel length 'l', the channel width 'w', and the sidewall dimension 's'. The gate dielectric thickness 'g' is shown and will affect the gate capacitance of the completed device. As will be further explained below, these device related physical parameters contribute to the current Idsat and therefore can be measured "in situ" or "in line" during the semiconductor processing. In embodiments described below, these measurements may be used with other parameters to predict device performance. The real measurements available at different process steps may be used in combination with predicted values for other quantitative data that together may form estimated performance criteria for the wafer. Advantages accrue by use of the embodiments because the predicted performance criteria are available during wafer processing and before the wafer is completely processed.

Figure 6:
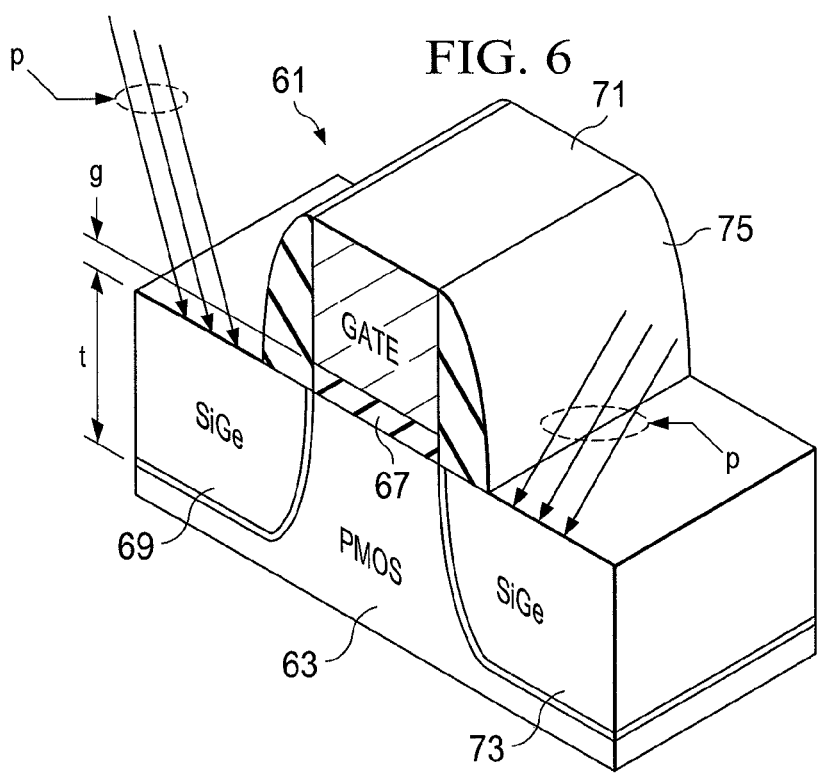
FIG. 6 depicts in a three dimensional cross-sectional view another planar MOSFET device for use with the embodiments.

FIG. 6 depicts in a simplified three dimensional projection an illustrative embodiment of a p-type MOSFET transistor 61 for use with the embodiments of the invention. The example device of FIG. 6 uses silicon germanium ("SiGe") material as the source and drain regions 69, 73 to enhance the MOSFET performance. As is known in the art, the lattice mismatch that occurs between the SiGe source and drain regions and the underlying substrate 63 may be utilized to improve carrier mobility ($\mu$). The carrier mobility is particularly important for p-type MOSFET devices, as the mobility $\mu$ obtained for these devices is less than that obtained for the n-type MOSFET devices formed on the same wafer using conventional planar MOS materials. The gate dielectric thickness for dielectric 67 is labeled 'g'. These are also important device related parameters that have characteristics that impact Idsat, as is described later. The pocket implant labeled 'p' is used to add dopant atoms underneath the sidewalls and further increase the transistor performance. The thickness of the SiGe layer is labeled 't'.

Figure 7:
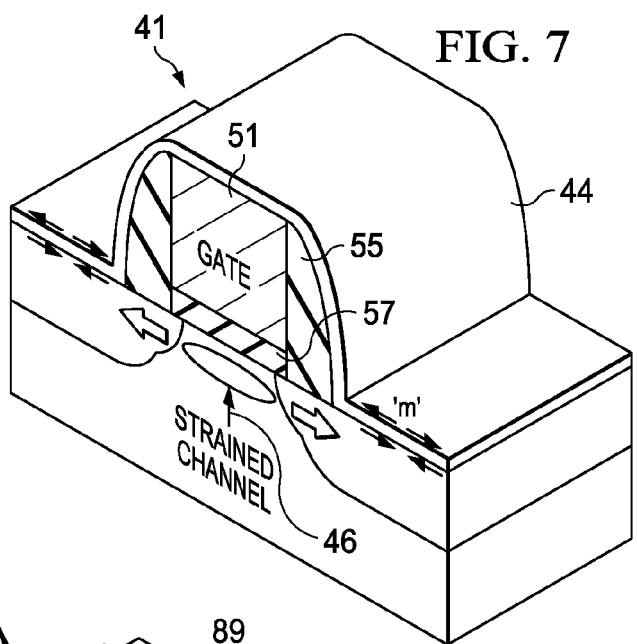
FIG. 7 depicts in a three dimensional cross-sectional view yet another planar MOSFET for use with the embodiments.

FIG. 7 depicts a planar MOSFET transistor such as that of FIG. 5 with the addition of a stress layer 44 to form a strained channel region 46. Again transistor 41 is depicted with gate 51. Gate dielectric 57, source and drain regions 49 and 53, and sidewalls 55 are shown as before. In addition a stress layer of, in this non-limiting illustrative example, silicon nitride 44, is shown overlying the transistor. The stress on the device results in a strained channel 46, which can increase carrier mobility $\mu$ and thus enhance the MOSFET device performance. The film stress 'm' is another device related parameter that contributes to the Idsat current obtained, as will be described below.

Figure 8A:
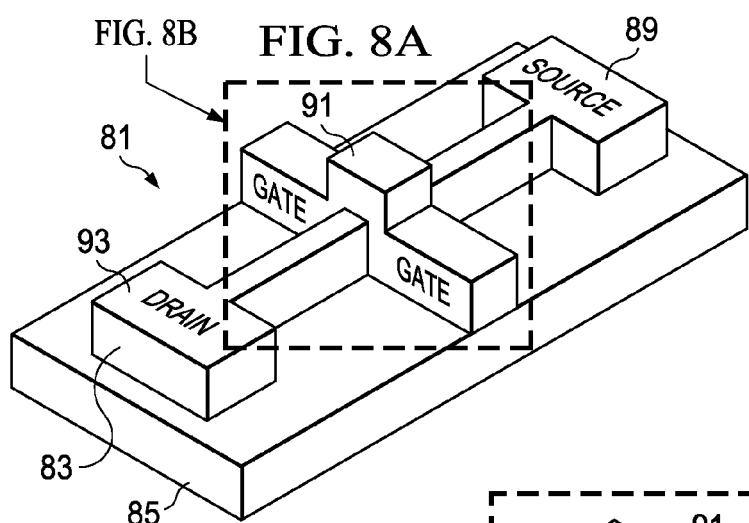
FIG. 8A depicts in a three dimensional view a finFET transistor for use with the embodiments.
Figure 8B:
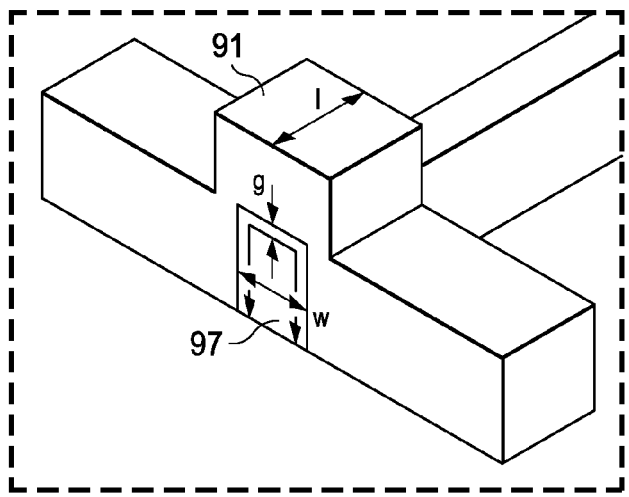
FIG. 8B depicts in a three dimensional cross-sectional view a portion of the finFET transistor of FIG. 8A.

FIGS. 8A and 8B depict, in simplified three dimensional views, the features of an illustrative embodiment finFET transistor for use with the embodiments. As shown in FIG. 8A, transistor 81 is formed at the intersection of a silicon or semiconductor body 83 with a gate 91. The body 83 is a layer that is patterned and doped to form a source and drain region 89, 93. As for the planar MOSFET, the source and drain regions are typically symmetrical doped regions and either region may be used as the source or the drain, depending on the circuit connections made to the device. The body 83 may be, for example, an epitaxially grown silicon or silicon on insulator ("SOI") over insulator 85. The conductive gate 91 is formed as a strip that intersects the body and overlies two sides and the vertical top of the body. The gate 91 may be doped polysilicon, or metal-gate materials may be used.

FIG. 8B depicts the transistor 81 in a three dimensional view with the gate dielectric 97 shown in cross-section. The gate dielectric 97 is formed over the two vertical sides and the top of the body 83, thus the channel width w of this finFET transistor 81 is the sum of the two sides and the gate portion overlying the top of the body. Sometimes this is referred to as a "triple gate" transistor. The finFET transistor thus has a much greater channel width, per semiconductor area, than a planar MOSFET such as in FIGS. 4, 5 and 6. The length of the transistor 81 shown as 'l' is the distance the gate material extends into the page. The gate dielectric again has is shown with a thickness 'g'.

Now that the physical structures for different forms of example MOSFET transistors have been illustrated, the use of the device performance criteria related physical parameters and their characteristics with the embodiments may be better understood.

The current Idsat for a MOSFET device may be described by the function relation:

Idsat=$f$(Active region Gate dielectric thickness ($g$), channel length ($l$), channel width ($w$), pocket implantation ($p$), Oxide sidewall dimension ($s$), SiGe thickness ($t$), film stress ($m$), rapid thermal anneal (RTA,$r$) ... etc.)   Equation 2

That is, the saturation current Idsat is a function of the physical characteristics of the semiconductor device that correspond to device related features that determine the Idsat current magnitude. A more precise relation commonly used is:

$$Idsat = \mu_{eff} C_{gate}\left(\frac{W}{L}\right)(V_D - V_t)^2 \qquad \text{Equation 3}$$

where:

$V_t$ = Threshold Voltage = $f(p, ...)$ $\mu_{eff}$ = Mobility strain = $f(t, m, r ...)$ $C_{gate}$ = Gate Dielectrtic = $f(g, ...)$ $\left(\frac{W}{L}\right)$ = Channel length & width = $f(w, l, s ...)$ Thus the current is a function of several variables each having a function depending on the device related physical characteristics of a device, which are either a result of a design parameter such as channel length, channel width, or a process parameter such as gate dielectric thickness, pocket implant concentration, sidewall dimensions, strain or stress applied, etc. Process variations in the device performance criterion related physical parameters, which may occur during the manufacture of the semiconductor wafer, will result in variations in the performance criteria, for example, Idsat.

Put another way, then, the performance metric Idsat may be projected as a function of these parameters, as $$Idsat=Idsat(\text{target})+\Sigma(X\text{ (in-line)}-X(\text{target}))*X(\text{sensitivity})) \qquad \text{Equation 4}$$

Note that while in this example embodiment, the performance criteria is Idsat, in other embodiments Equation 4 may be extended to other device performance criteria and a function may be established that relates device performance criteria related physical parameters to an expected criteria, using the same form. This relationship may be expanded to reflect the in line or in situ measured values, and the "target" or expected values for a device, and then formulated for several measurable or observable parameters; such as in this non-limiting example:

$$Idsat=Idsat(\text{target})+(w(\text{in-line})-w(\text{target}))*w(\text{sensitivity})+(l(\text{in-line})-l(\text{target}))*l(\text{sensitivity})+(t(\text{in-line})-t(\text{target}))*t(\text{sensitivity})+\ldots\text{etc.} \qquad \text{Equation 5}$$

where "w"=channel width, "l"=channel length, "t"=SiGe thickness, etc.

In the above equation, the sensitivity coefficient for each factor is a weighting factor that indicates the sensitivity of the Idsat current criteria to the variation of the samples from expected target values to the "in situ" or in line measurement values observed. That is, a difference is taken between a measured in line value and a target value, and this is then multiplied by the sensitivity coefficient. These values are then used to project a device performance value for Idsat. This process can be performed at various steps during the semiconductor processing as additional in line measurements of device related parameters become available. For example, in the MOSFET active device fabrication, gate oxide thickness is available when the gate oxide processing is complete, later the channel width 'w' and channel length 'l' device related parameters become available, and subsequent projections for Idsat may be made using those values.

In an embodiment, as a semiconductor wafer is processed according to a set of design rules and process recipes, the resulting device related physical parameters may be measured in line". The measured values of the wafer can be used with the target or expected values of device related parameters of yet to be performed process steps, and an Idsat value can be projected using Equation 5, for example. While this embodiment is explained for illustration herein in terms of the current Idsat, the embodiments are not so limited and other device performance metrics such as threshold voltage Vt, for example, could likewise be used and a projection formulated for those device performance criteria. If the in line wafer is projected to have a performance metric outside the acceptable range, adjustments in yet to be performed process steps may be made to compensate for the performance variation; and additional projection calculations made. In this manner, the wafer may be dynamically compensated during wafer processing to achieve the desired device performance criteria within an acceptable range, and thus form a yielding wafer. In contrast, in conventional known wafer processing approaches, the performance metric is evaluated only after production to the WAT stage, and many wafers are scrapped as non-yielding wafers as a result. No adjustments may be made in the conventional approach and thus defects in early processes cannot be compensated for. The embodiments therefore advantageously provide a method to increase yield by dynamically adjusting the process steps to ensure an acceptable device performance for the wafer in process.

Figure 9:
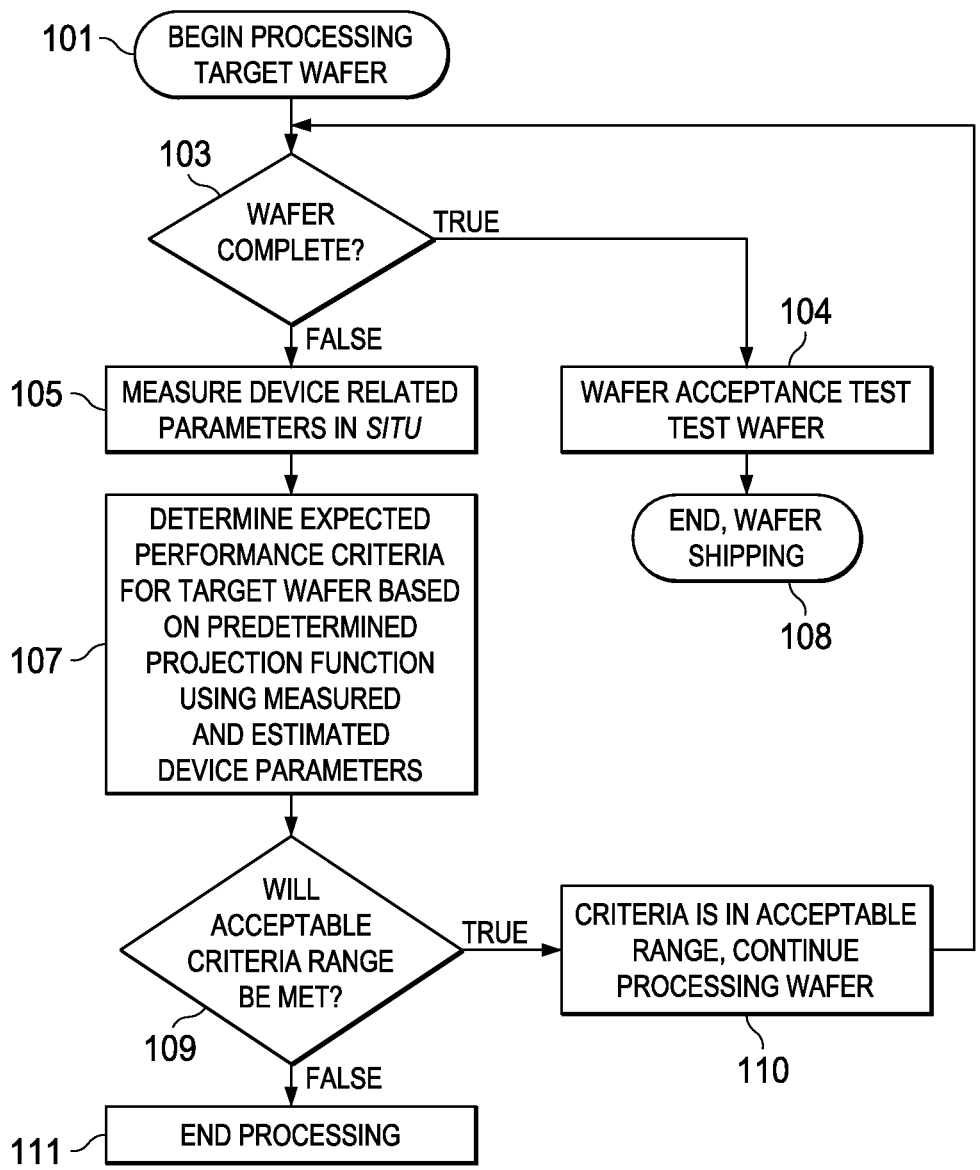
FIG. 9 depicts in a flow diagram a method embodiment.

FIG. 9 depicts in a flow diagram the method steps of an illustrative embodiment. Note that while the description above was provided with an illustrative performance metric, Idsat, other metrics could also be evaluated in similar fashion, projections can be calculated for these other metrics, and these methods form alternative method embodiments that are contemplated by the claims.

In FIG. 9, the method embodiment begins at step 101 by performing wafer processing steps on the target wafer. At step 103 a test is made to determine if the wafer processing is complete, is so, then the method transitions to state 104 to perform WAT testing, and then at step 105, the wafer is shipped and the process ends. Wafer tests such as WAT level testing may be done at step 104.

If the condition at step 103 is false and wafer processing is not complete, the method transitions to step 105. In 105, after some processing has completed a device performance criterion related physical parameter, an in line process measurement is made. For example, if the gate dielectric is deposited, then the thickness of the gate dielectric 'g' can be measured. Alternatively, if the gate electrode has been patterned, then the channel length 'l' and channel width 'w' can be measured.

At step 107, an expected device performance criterion for the wafer being processed can be projected, using a projection such as the one described above in Equation 5. The projection is based on previous target values using results from wafers previously manufactured in the process, and the relationships among the physical characteristics and the sensitivity to these physical characteristics of the performance criteria as shown in Equation 5. For those steps already completed, the "in line" measurements can be compared to the "target" values (the expected values for wafers that have performance criteria that are acceptable.) For the processing steps not yet completed, the projection can use the expected target values for those parameters. The calculated projection indicates the expected performance criteria for devices currently being manufactured on the wafer in process.

At step 109, in a decision step the expected performance criterion is compared to the acceptable range. If the comparison is true, the method continues at step 110 and additional semiconductor processing is performed. If the comparison at step 109 is false, then in this illustrative and non-limiting embodiment, the wafer processing ends. It would be inefficient and wasteful of time and materials to continue to process a wafer where the MOSFET devices are projected to fail the performance criteria. In this embodiment, the in process wafer is scrapped. Instead of continuing to process a faulty wafer, the semiconductor process may now be evaluated to determine where the wafer manufacture process is faulty and correct it for future wafers. In this manner, the process is constantly monitored and yield defects due to process variations may be caught immediately and early corrective action taken. Thus, the use of the method embodiments lowers per unit costs and increases yields. Further, the defective wafers are not processed and sent to the WAT stage, saving time and effort by not wasting tester time on these wafers. This is in sharp contrast to the conventional approaches which identify process related circuit defects only on completed wafers and at the WAT stage.

Figure 10:
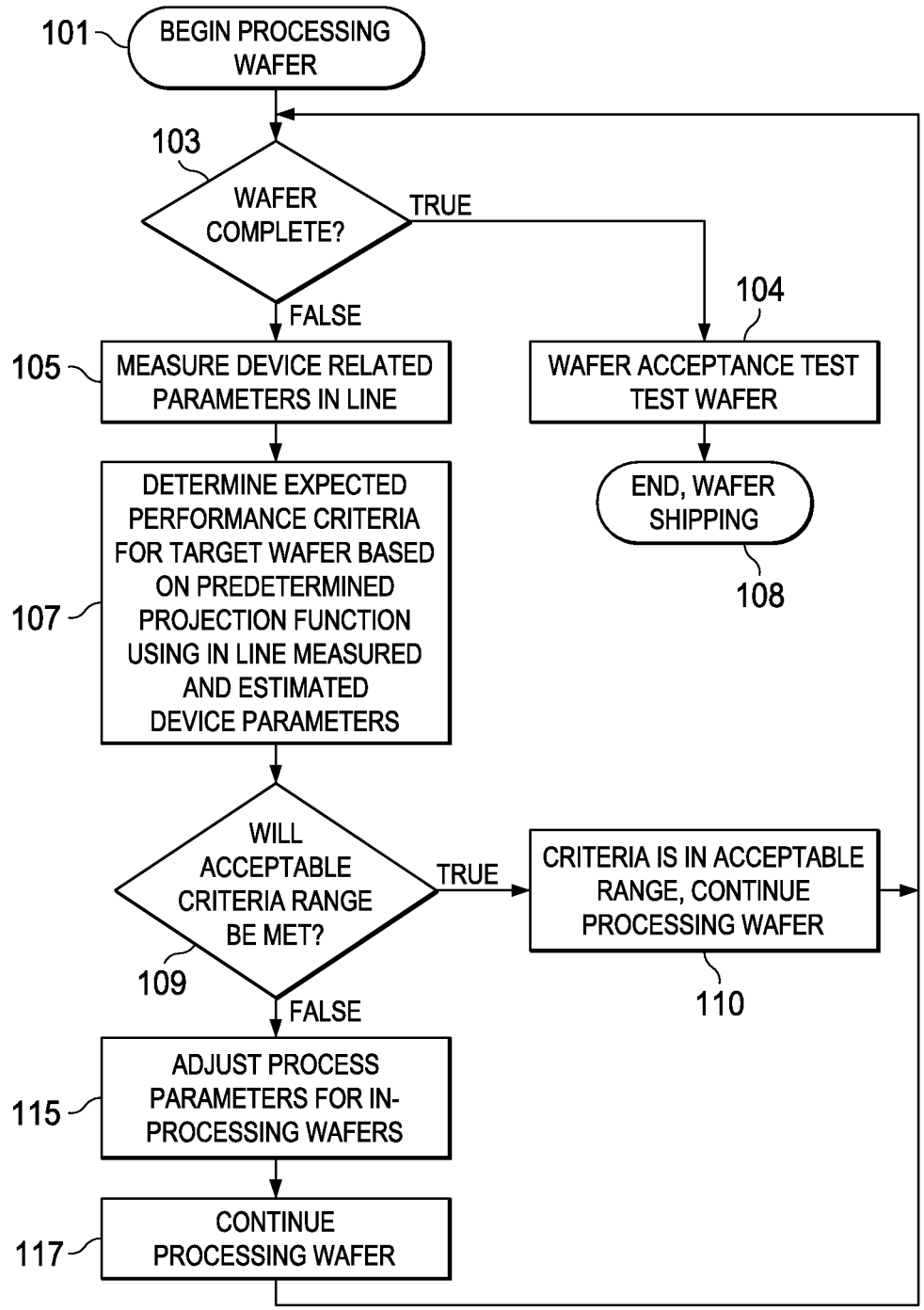
FIG. 10 depicts in another flow diagram an alternative method embodiment.

In FIG. 10, an alternative method embodiment approach is depicted. Some of the steps of this method are the same as in the previous figure and common reference numbers are used for these steps. At step 101, the method begins by processing a wafer. At step 103, the wafer complete comparison is made, if the wafer is complete, the condition is true and the method transitions to state 104, and WAT can begin; and at step 108, the process ends. At step 105, an "in line" measurement of the device related physical results for the performance criteria is made. For example, the gate dielectric may be completed at this stage and in that case, the thickness of the gate dielectric 'g' may be checked. Other parameters, such as the sidewall dimension, the SiGe thickness, the channel width and length, may be measured in line as the wafer processing continues. In step 107, the measured physical parameters that relate to the device performance criterion are used in calculating the projection function, to determine the device performance expected for the target wafer in process. After the projection is made, in step 109 a comparison is made. For example, if the Idsat projection is made, the projected value for the wafer in process, based on both the in line measurement results obtained so far in the wafer processing, and the expected target values for the remaining process steps, is compared to an acceptable range. If the projected device performance criterion is in acceptable range, the method transitions to state 110 and semiconductor wafer processing continues, the method repeating back to step 103.

If instead at the compare step 109 the acceptable performance criterion will not be met, the method transitions to step 115, where a process adjustment is made for this and other in processing wafers. If a compensating adjustment can be made in subsequent processing steps that affect the device related parameters to impact the device performance criterion, then the wafer processing continues at step 117, and again the process returns to step 103.

For simplicity, an additional possible step is not shown but may be performed. If at the comparison 109 the wafer in process will not meet the acceptable range for the projected criteria and the adjustments to the process cannot compensate the wafer to reach an acceptable range, the process may end early and the wafer in process may be scrapped, saving any additional time and materials that would otherwise be used.

This method embodiment of FIG. 10 is an alternative embodiment that extends the approach of the prior embodiment; however, instead of stopping the process when the acceptable criteria range test of step 109 fails, this alternative method embodiment the method adjusts a yet to be performed process step or steps, and continues the semiconductor wafer processing. In this manner the wafer may still continue processing and the completed devices on the wafer may meet the acceptable range for the device performance criterion, such as Idsat.

If the wafer processing can be successfully completed, the yield will increase as the wafer is not scrapped, and the per-unit cost for the resulting integrated circuits will fall.

Unlike the conventional approaches, the method embodiment described here advantageously allow for the processing to be dynamically adjusted during the semiconductor processing and the wafer may be successfully completed, even if a particular device related physical parameter (for example, gate dielectric thickness) is outside the target range.

The method embodiments may be performed using automated wafer processing systems. Such a system may include various work stations, enclosed or open process chambers, and wafer handling tools such as arms or even robots. A programmable processor may be provided and executable program software may be stored in a computer readable medium including instructions for causing the programmable processor to operate the system to perform the embodiment methods. The software, when executed by the processor, may configure the processor to perform the method steps. The computer readable medium may include floppy disks, hard disks, thumb drives, non-volatile memory devices such as NAND flash and NOR flash devices, EEPROM, EPROM, ROM and the like. The software may be stored on optical disks, CDs, DVDs and the like. The software may reside within the system or even within the processor if storage memory is available within the processor. Each of these alternatives is contemplated as an embodiment and falls within the scope of the appended claims.

Figure 11:
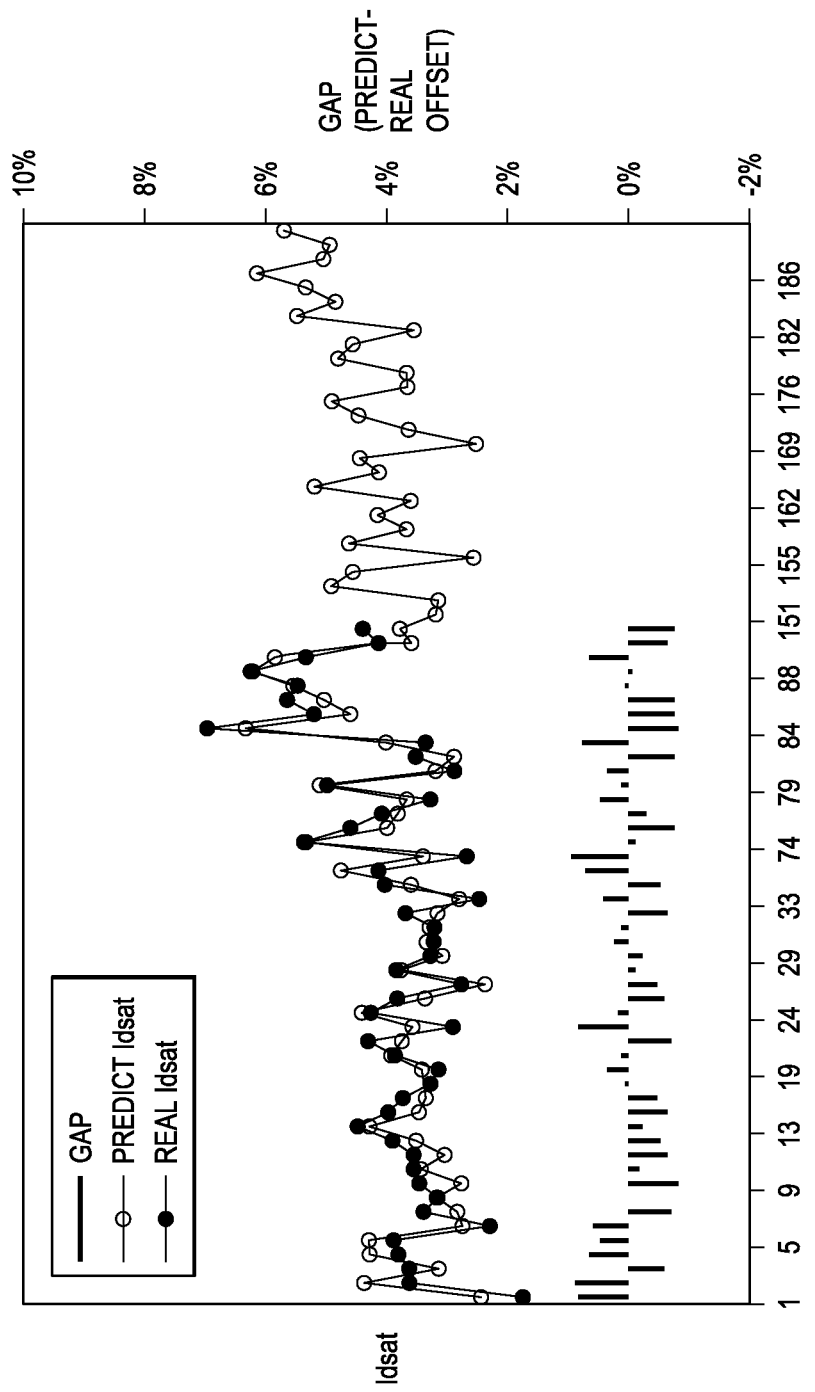
FIG. 11 depicts in a chart view a plot of both predicted Idsat values obtained using the embodiments and measured Idsat values for completed wafers, illustrating the accuracy of the performance projections by use of the embodiments.

FIG. 11 depicts the results obtained using the projection of the embodiments for Idsat described above, which are plotted against the real measured Idsat data for an example semiconductor process. The "gap" between the predicted Idsat values, and the real or measured Idsat values, for a set of wafers, ranges between +1% and −1%; thus it can be seen from FIG. 11 that the projection is very accurate. FIG. 11 is a chart showing the real Idsat value of complete wafers after WAT illustrates the point that the predicted Idsat value related physical parameters can be performed using Equation 5 to a high degree of accuracy. Physical parameters can be measured at various steps during the semiconductor processing as additional in line measurements of device. So, the projected value of predicted Idsat based on in line measurement results can be obtained in line during the wafer processing. The "gap" between the predicted Idsat values and the real or measured Idsat values ranges between +1% and −1%; thus it can be seen from FIG. 11 that the projection of predicted Idsat values is very accurate. Therefore, predicted Idsat may replace the real or measured Idsat values. When it is determined from the predicted Idsat that a wafer cannot meet the acceptable range of performance, it will be identified early in the process and further wafers in early processes can be dynamically adjusted or process problems that are identified can be solved in order to achieve device performance criteria within an acceptable range. Furthermore, wafers of predicted Idsat can be adjusted to compensate on subsequent steps. If that compensation isn't possible, the method embodiments operate to stop processing the defective wafers. This results in a saving of time and increasing yield and reduces the costs of the finished devices.

In an embodiment, a method comprises receiving a semiconductor wafer; performing semiconductor processing on the semiconductor wafer forming active devices that, when completed, will exhibit a device performance criteria; during the semiconductor processing, measuring in line at least one device performance criteria related physical parameter; projecting an estimated value for the device performance criteria of the active devices using the at least one in line measurement and using target measurements for device performance criteria related physical parameters corresponding to later semiconductor processing steps; comparing the estimated value for the device performance criteria to an acceptable range; determining, based on the comparing, whether the active devices on the semiconductor wafer will have a device performance criteria within the acceptable range when the semiconductor wafer is completed; based on the determining, continuing the above steps of performing semiconductor processing, measuring, projecting, determining, until the semiconductor processing is complete for the semiconductor wafer. In another embodiment, the above method is performed and the projecting an estimated value further comprises executing a function comprising calculating a sum of weighted coefficients for at least two device related parameters including computing a difference between measured in line values and an estimated value, and multiplying the difference by a predetermined sensitivity value for the device performance criteria. In a further embodiment, methods above include wherein the device performance criteria is a drain saturation current for a MOSFET transistor. In another embodiment, the methods above are performed and further if the determining results in a finding that the active devices will not exhibit the device performance criteria in an acceptable range, the method ends the semiconductor processing of the wafer. In yet another embodiment, the above methods are performed wherein forming the active devices comprise forming one or more MOSFET transistors. In still another alternative embodiment, the above methods are performed and the device performance criterion is the drain current in saturation for the one or more MOSFET transistors.

In yet another alternative embodiment, the above methods are performed wherein the at least one device performance criteria related physical parameter is one selected from the group consisting essentially of a gate dielectric thickness, a channel width, a channel length, and a sidewall dimension. In a further embodiment, the above methods are performed and the at least one device performance criteria related physical parameter is one selected from the group consisting essentially of a silicon germanium thickness, an implant dosage parameter, and a strain constant. In still another alternative embodiment, the above methods are performed wherein forming the active devices comprises forming one or more finFET transistors. In a further alternative embodiment, the at least one device performance criteria related physical parameter is one selected from the group consisting essentially of a channel length measured for the finFET transistor, a channel width, and a gate oxide thickness. In a further alternative embodiment, the above methods are performed and after the semiconductor wafer processing is complete, the method continues by measuring the performance criteria for at least one of the active devices.

In another embodiment that is an alternative, a method is performed, receiving a semiconductor wafer; performing semiconductor processing on the semiconductor wafer forming active devices that, when completed, will exhibit a performance criteria that can be measured; during the semiconductor processing, measuring in line at least one device performance criteria related physical parameter; projecting an estimated value for the device performance criteria of the active devices using the in line measurement and using target measurements for at least one other device performance criteria related parameter to be formed in later semiconductor processing steps; comparing the estimated value for the performance criteria to an acceptable range; determining, based on the comparing, whether the active devices formed on the semiconductor wafer will have a performance criteria within the acceptable range when the semiconductor wafer is completed; based on the determining, dynamically adjusting subsequent semiconductor processing steps that correspond to at least one other device performance criteria related physical parameter; and continuing the above steps of performing semiconductor processing, measuring, projecting, determining, and dynamically adjusting until the semiconductor processing is complete for the semiconductor wafer. In another embodiment, the method is performed wherein projecting an estimated value further comprises calculating an estimated value by computing a sum of weighted coefficients for at least two device performance criteria related physical parameters including computing a difference between a measured in line value and either an estimated value, and multiplying the difference by a predetermined sensitivity coefficient for the device performance criteria. In still another embodiment, the above method is performed wherein the performance criteria comprises a drain current for a MOSFET transistor in saturation. In a further alternative embodiment, the above method is performed wherein forming active devices further comprises forming at least one MOSFET transistor. In yet another method embodiment, forming the active devices comprises forming at least one MOSFET transistor that exhibits as the performance criteria a drain current in saturation mode, Idsat. In yet another alternative method, the above methods further comprise measuring in line at least one physical parameter selected from the group consisting essentially of a gate dielectric thickness, a channel length, a channel width, and a sidewall dimension.

In an alternative embodiment, a system for manufacturing integrated circuits on a semiconductor wafer is provided, the system including a programmable processor and software comprising executable program instructions stored on a computer readable medium, the executable program instructions stored on the computer readable medium configured, when executed by the programmable processor, to cause the system to perform receiving a semiconductor wafer; performing semiconductor processing on the semiconductor wafer forming active devices that, when completed, will exhibit a device performance criteria; during the semiconductor processing, measuring in line at least one device performance criteria related physical parameter; projecting an estimated value for the device performance criteria of the active devices using the at least one in line physical parameter measurement and using target values for at least one other device performance criteria related physical parameter to be formed in later semiconductor processing steps; comparing the estimated value for the device performance criteria to an acceptable range; determining, based on the comparing, whether the active devices formed on the semiconductor wafer will have a device performance criteria within the acceptable range when the semiconductor wafer is completed; based on the determining, continuing the above steps of performing semiconductor processing, measuring, projecting, comparing, determining, until the semiconductor processing is complete for the semiconductor wafer. In yet another embodiment, in the above system the executable instructions stored on the physical media are further configured to, when executed by the processor, cause the system to perform: based on the determining, dynamically adjusting subsequent semiconductor processing steps; and continuing the above steps of performing semiconductor processing, measuring, projecting, determining, dynamically adjusting until the semiconductor processing is complete for the semiconductor wafer. In a further alternative embodiment, in the above system, the executable instructions are further configured to, when executed by the processor, cause the system to perform forming active devices that comprise one or more MOSFET transistors.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
   receiving a semiconductor wafer for semiconductor processing to form active devices thereon;
   performing semiconductor processing on the semiconductor wafer forming active devices that, when completed, will exhibit a device performance criteria;
   during the semiconductor processing and prior to completing the forming the active devices on the semiconductor wafer, measuring in line at least one physical parameter of the active devices, wherein the at least one physical parameter is related to a performance criteria of the active devices at completion;
   projecting an estimated value for the device performance criteria of the active devices using the at least one in line measurement and using estimated measurements for device performance criteria related physical parameters corresponding to semiconductor processing steps that are yet to be performed on the semiconductor wafer;
   comparing the estimated value for the device performance criteria to an acceptable range;
   determining, based on the comparing, whether the active devices on the semiconductor wafer will have a device performance criteria within the acceptable range when the semiconductor wafer is completed; and
   based on the determining, continuing the above steps of performing semiconductor processing, measuring, projecting, determining, until the semiconductor processing is complete for the same semiconductor wafer.

2. The method of claim 1, wherein the projecting an estimated value further comprises executing a function comprising calculating a sum of weighted coefficients for at least two device related physical parameters including computing a difference between measured in line values and target values, and multiplying the difference by a predetermined sensitivity value for the device performance criteria.

3. The method of claim 2 wherein the device performance criteria is a drain saturation current for a MOSFET transistor.

4. The method of claim 1 and further comprising:
   if the determining results in finding that the active devices will not exhibit the device performance criteria in an acceptable range, ending the semiconductor processing of the wafer.

5. The method of claim 1, wherein forming the active devices comprises forming one or more MOSFET transistors.

6. The method of claim 5, wherein the device performance criteria is the drain current in saturation for the one or more MOSFET transistors.

7. The method of claim 6, wherein the at least one device performance criteria related physical parameter is one selected from the group consisting essentially of a gate dielectric thickness, a channel width, a channel length, and a sidewall dimension.

8. The method of claim 6, wherein the at least one device performance criteria related physical parameter is one selected from the group consisting essentially of a silicon germanium thickness, an implant dosage parameter, and a strain constant.

9. The method of claim 1 wherein forming the active devices comprises forming one or more finFET transistors.

10. The method of claim 9 wherein the at least one device performance criteria related physical parameter is one selected from the group consisting essentially of a channel length measured for the finFET transistor, a channel width, and a gate oxide thickness.

11. The method of claim 1 and further comprising:
    after the semiconductor wafer processing is complete, measuring the performance criteria for at least one of the active devices.

12. A method, comprising:
    receiving a semiconductor wafer;
    performing semiconductor processing on the semiconductor wafer forming active devices that, when completed, will exhibit a performance criteria that can be measured;
    during the semiconductor processing and prior to completing the forming the active devices on the semiconductor wafer, measuring in line at least one device performance criteria related physical parameter of the active devices;
    projecting an estimated value for the device performance criteria of the active devices using the at least one in line measurement and using target measurements for at least one other device performance criteria related parameter to be formed in semiconductor processing steps that are yet to be performed on the semiconductor wafer;
    comparing the estimated value for the performance criteria to an acceptable range;
    determining, based on the comparing, whether the active devices formed on the semiconductor wafer will have a performance criteria within the acceptable range when the semiconductor wafer is completed;
    based on the determining, dynamically adjusting subsequent semiconductor processing steps to be performed on the same semiconductor wafer that correspond to at least one other device performance criteria related physical parameter; and
    continuing the above steps of performing semiconductor processing, measuring, projecting, determining, and dynamically adjusting until the semiconductor processing is complete for the semiconductor wafer.

13. The method of claim 12, wherein projecting an estimated value further comprises: calculating an estimated value by computing a sum of weighted coefficients for at least two device performance criteria related physical parameters including computing a difference between a measured in line value and a target value, and multiplying the difference by a predetermined sensitivity coefficient for the device performance criteria.

14. The method of claim 13 wherein the performance criteria comprises a drain current for a MOSFET transistor in saturation.

15. The method of claim 12, wherein performing semiconductor processing on the semiconductor wafer forming active devices further comprises forming at least one MOSFET transistor.

16. The method of claim 15, wherein forming active devices further comprises forming at least one MOSFET transistor that exhibits as the performance criteria a drain current in saturation mode, Idsat.

17. The method of claim 16, wherein during the semiconductor processing, measuring in line at least one device performance criteria related physical parameter further comprises measuring at least one physical parameter selected from the group consisting essentially of a gate dielectric thickness, a channel length, a channel width, and a sidewall dimension.

18. A system for manufacturing integrated circuits on a semiconductor wafer, the system including a programmable processor and software comprising executable program instructions stored on a computer readable medium, the executable program instructions stored on the computer readable medium configured, when executed by the programmable processor, to cause the system to perform:

receiving a semiconductor wafer;

performing semiconductor processing on the semiconductor wafer forming active devices that, when completed, will exhibit a device performance criteria;

during the semiconductor processing and prior to completing the forming the active devices on the semiconductor wafer, measuring in line at least one device performance criteria related physical parameter of the active devices;

projecting an estimated value for the device performance criteria of the active devices using the at least one in line physical parameter measurement and using estimated measurements for at least one other device performance criteria related physical parameter to be formed in semiconductor processing steps that are yet to be performed on the semiconductor wafer;

comparing the estimated value for the device performance criteria to an acceptable range;

determining, based on the comparing, whether the active devices formed on the semiconductor wafer will have a device performance criteria within the acceptable range when the semiconductor wafer is completed; and based on the determining, continuing the above steps of performing semiconductor processing on the same semiconductor wafer, measuring, projecting, comparing, determining, until the semiconductor processing is complete for the semiconductor wafer.

19. The system of claim 18, wherein the executable instructions stored on the physical media are further configured to, when executed by the processor, cause the system to perform:

based on the determining, dynamically adjusting subsequent semiconductor processing steps to be performed on the same semiconductor wafer; and continuing the above steps of performing semiconductor processing, measuring, projecting, determining, dynamically adjusting until the semiconductor processing is complete for the semiconductor wafer.

20. The system of claim 18, wherein the executable instructions are further configured to, when executed by the processor, cause the system to perform:

forming active devices wherein the active devices comprise one or more MOSFET transistors.

* * * * *